(12) United States Patent
Zhang

(10) Patent No.: US 9,395,595 B2
(45) Date of Patent: Jul. 19, 2016

(54) ELECTRONIC PAPER DISPLAY DEVICE HAVING SLANTED BORE WALLS AND COLOR FILTER AND MANUFACTURING METHOD THEREOF

(75) Inventor: Zhuo Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 219 days.

(21) Appl. No.: 13/701,365

(22) PCT Filed: Sep. 13, 2012

(86) PCT No.: PCT/CN2012/081348
§ 371 (c)(1),
(2), (4) Date: Nov. 30, 2012

(87) PCT Pub. No.: WO2013/075535
PCT Pub. Date: May 30, 2013

(65) Prior Publication Data
US 2013/0208341 A1  Aug. 15, 2013

(30) Foreign Application Priority Data
Nov. 23, 2011  (CN) .......................... 2011 1 0376760

(51) Int. Cl.
*G02B 26/00* (2006.01)
*G02F 1/167* (2006.01)
*H05K 13/00* (2006.01)

(52) U.S. Cl.
CPC ................ *G02F 1/167* (2013.01); *H05K 13/00* (2013.01); *G02F 2001/1672* (2013.01); *Y10T 29/49002* (2015.01)

(58) Field of Classification Search
CPC ............ G02F 1/167; G02F 2001/1676; G02F 2001/1678; G02B 26/005; G09G 3/344

USPC ......... 359/290–298, 237–240, 242, 245–246, 359/250–252, 265–271
See application file for complete search history.

(56) References Cited

U.S. PATENT DOCUMENTS

| 7,388,572 | B2 * | 6/2008 | Duthaler et al. | ............... 345/107 |
| 7,495,819 | B2 * | 2/2009 | Sakurai et al. | ................ 359/296 |

(Continued)

FOREIGN PATENT DOCUMENTS

| CN | 101652709 A | 2/2010 |
| CN | 102654710 A | 9/2012 |
| JP | 2005-128142 A | 5/2005 |
| JP | 2011-095497 A | 5/2011 |

OTHER PUBLICATIONS

International Search Report dated Dec. 27, 2012; PCT/CN2012/081348.

(Continued)

*Primary Examiner* — Bumsuk Won
*Assistant Examiner* — Tamara Y Washington
(74) *Attorney, Agent, or Firm* — Ladas & Parry LLP

(57) ABSTRACT

Embodiments of present invention provide an electronic paper display device and a manufacturing method thereof. The electronic paper display device comprises a substrate, a first conducting layer on the substrate and a slanted microbore layer provided on the first conducting layer. The slanted microbore layer comprises a plurality of slanted microbores of a color, electrophoretic display particles are enclosed within the slanted microbores and have different colors from that of the slanted microbores. Each of the slanted microbores comprises an orifice, slanted bore walls and a bore bottom, the angle between the slanted bore walls and the substrate is less than 90°, and the vertical projection of the orifice onto the surface of the substrate is located outside of the bore bottom of the slanted microbore.

13 Claims, 3 Drawing Sheets

(56) References Cited

U.S. PATENT DOCUMENTS

| | | | |
|---|---|---|---|
| 7,901,863 B2* | 3/2011 | Yamada et al. | 430/270.1 |
| 2002/0191133 A1* | 12/2002 | Enomoto et al. | 349/113 |
| 2010/0118383 A1 | 5/2010 | Van Abeelen et al. | |
| 2010/0165448 A1* | 7/2010 | Sprague | G02F 1/167 359/296 |

OTHER PUBLICATIONS

International Preliminary Report on Patentability dated May 27, 2014; PCT/CN2012/081348.

First Chinese Office Action dated Aug. 28, 2013; Appln. No. 201110376760.9.

* cited by examiner

US 9,395,595 B2

ELECTRONIC PAPER DISPLAY DEVICE HAVING SLANTED BORE WALLS AND COLOR FILTER AND MANUFACTURING METHOD THEREOF

TECHNICAL FIELD

Embodiments of present invention relate to an electronic paper display device and a manufacturing method thereof.

BACKGROUND

An electronic paper display technique is a novel display technique capable of achieving paper-like reading experience. Because electronic paper displays are comfortable for use, ultrathin and portable, flexible, and of extra-low power consumption, electronic paper display devices have gained widely attention and application in the display area.

Most of electronic paper display techniques are implemented in an electrophoretic display method. Electrophoretic display particles of colors are used in the electrophoretic display method, arranged in order by the change of an externally applied electric field, and thus present certain colors so as to exhibit different images.

In the existing electronic paper display device using the electrophoretic display method, generally, electrophoretic display particles of at least two kinds of colors, for example black particles and white particles, are necessary for bicolor display or multicolor display. However, it's usually difficult for the display particles of at least two colors to move and remain stable under the externally applied electric field; therefore, not only a certain limitation is imposed onto the selection of the display particle about its the category, size and so on, but also difficulty exists for the control of the display particles when the display particles move under the externally applied electric field. Hence, it's not easy for the existing electronic paper display device in the electrophoretic display method to realize bicolor display or multicolor display.

SUMMARY

One of technical problems which the embodiments of present invention intends to resolve is to provide an electronic paper display device and a manufacturing method thereof, so as to realize bicolor display or multicolor display in an easy way.

One embodiment of the Present invention provides an electronic paper display device comprising a substrate, a first conducting layer on the substrate and a slanted microbore layer arranged on the first conducting layer, wherein the slanted microbore layer comprises a plurality of slanted microbores of a color, electrophoretic display particles are enclosed within the slanted microbores and have different colors from those of the slanted microbores; each of the slanted microbores comprises an orifice, slanted bore walls and a bore bottom, the angle between the slanted bore walls and the substrate is less than 90°, and the vertical projection of the orifice onto the surface of the substrate is located outside of the bore bottom of the slanted microbore.

Another embodiment of present invention provides a manufacturing method for an electronic paper display device comprising: providing a substrate formed with a first conducting layer; forming a slanted microbore layer on the first conducting layer, wherein he slanted microbore layer comprises a plurality of slanted microbores of a color, and each of the slanted microbores comprises an orifice and slanted bore walls, the angle between the slanted bore walls and the substrate is less than 90°, and the vertical projection of the orifice onto the surface of the substrate is located outside of a bore bottom of the slanted microbore; the slanted microbore is provided therein with electrophoretic display particles, colors of which is different from those of the slanted microbore; enclosing the orifices of the slanted microbores.

In the electronic paper display device and the manufacturing method thereof provided by the embodiments of the present invention, the electrophoretic display particles have different colors from those of the slanted microbores, and furthermore, the vertical projection of the orifices of the slanted microbores toward the substrate is located within the vertical projection of the slanted bore walls toward the substrate or is located outside of the bore bottom of the slanted microbore. In this way, in addition to the electrophoretic display particles, the colors of the slanted microbore walls are also used for display. Hence, the kinds of the electrophoretic display particles can be reduced in realizing bicolor or multicolor display, thereby lowering requirements for the kinds, dimensions, etc. Furthermore, it even become easier to control the motion of the electrophoretic display particles and to achieve bicolor or multicolor display.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

The objects, solutions and advantages of the embodiments of present invention will be more apparent from the following clear and complete description about the embodiments of present invention in connection with embodiments and accompany drawings. Obviously, the described embodiments are merely part of the embodiments of the present invention, but not all the embodiments. Based on the described embodiments of present invention, all the other embodiments achieved by the ordinary skilled in this art without any creative work belong to the protective scope of the present invention.

Figure 1:
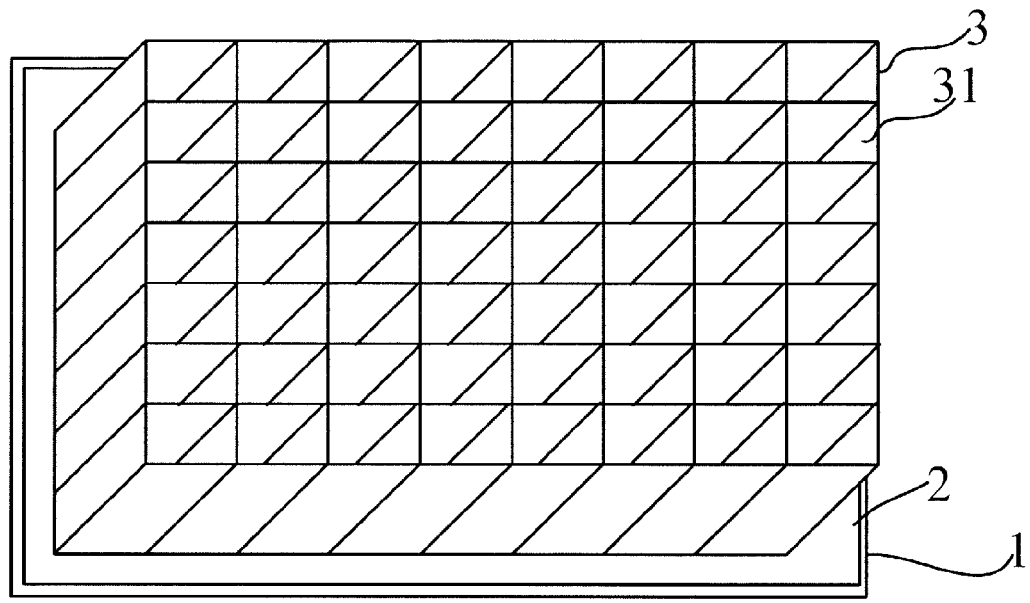
FIG. 1 is structural schematic view of an electronic paper display device provided by the present invention.
Figure 2:
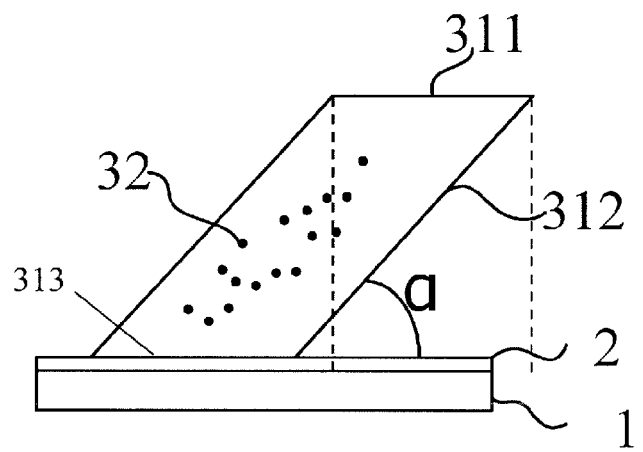
FIG. 2 is a principle schematic view for the configuration of a single slanted microbore of the electronic paper display device shown in FIG. 1.

FIG. 1 is one specific embodiment of an electronic paper display device provided by the present invention, as shown in FIGS. 1 and 2. The electronic paper display device of this embodiment comprises a substrate 1, a first conducting layer 2 arranged on the substrate 1, and a slanted microbore layer 3 provided on the first conducting layer 2.

The substrate 1 is formed with the first conducting layer 2 thereon, the slanted microbore layer 3 is provided on the first conducting layer 2, and the slanted microbore layer 3 comprises a plurality of slanted microbores 31 located therein. Each of the slanted microbores 31 corresponds to one sub-pixel of the display device, and electrophoretic display particles 32 are enclosed within each of the slanted microbores 31, and the electrophoretic display particles 32 have colors, such as black particles, white particles, and so on. Under the action of the externally applied electric field, the electrophoretic display particles 32 within each of the slanted microbores 31 will conduct electroporesis, causing the sub-pixel corresponding to the slanted microbores 31 to present one color; then these slanted microbores 31 present different arrangement manner of different color dots, constitute a certain pattern, thus reach the object of exhibiting different pictures.

For example, the electrophoretic display particles 32 in a powder condition are arranged within the slanted microbores 31. For example, the electrophoretic display particles 32 are enclosed within the slanted microbores 31 by way of sealing compound or membrane adhering. For example, a colorless clear solution can be further enclosed within the slanted microbores 31, and the electrophoretic display particles 32 are distributed within the colorless clear solution.

The slanted microbores 31 are opaque by themselves, and are in colors, such as white. Here, it's necessary for the colors of the slanted microbores 31 to be different from those of the electrophoretic display particles 32; for example, the colors can be selected according to the bicolor display to be achieved.

As shown in FIG. 2, each of the slanted microbores 31 comprises an orifice 311, slanted bore walls 312 and a bore bottom 313, and the angle a between the slanted bore walls 312 and the substrate 1 arranged in a horizontal direction is less than 90°, and further, the vertical projection of the orifice 311 with respect to the surface of the substrate 1 (indicated by dotted line in FIG. 2) is located within the vertical projection of the right side slanted bore wall 312 in the figure toward the substrate 1 or is located outside of the bore bottom 313. In this way, when watched downward vertically along the orifice 311, only the slanted bore walls 312 can be seen but the bore bottom 313 of the slanted microbores 31 are invisible. In a case in which the consumer's eyes are located on the side of the substrate 1 when in use, the color of the electrophoretic display particles 32 is displayed when the electrophoretic display particles 32 are located at the surface of the slanted microbores 31 on the side of the substrate 1; the color of the slanted bore walls 312 is displayed when the electrophoretic display particles 32 are located at the surface on the side of orifice 311 of the slanted microbores 31, because the electrophoretic display particles 32 are hided by the slanted bore walls 312. Hence, when the electronic paper display device provided by this embodiment is in display, the color of the slanted bore walls 312 can also be one of the displaying colors for the electronic paper display device of this embodiment, besides the color of the electrophoretic display particles 32 can be used for display a color.

The electronic paper display device provided by this embodiment displays colors using the color of the slanted bore walls 312 as well as the electrophoretic display particles 32, and therefore, in realizing bicolor or multicolor display, the electrophoretic display particles 32 are not only used for displaying colors. Hence, in the electronic paper display device provided in this embodiment, the electrophoretic display particles 32 can be reduced in the kinds of colors. For example, the electrophoretic display particles 32 of only one color, with the cooperation of the slanted bore walls 312 of another color, can achieve bicolor display, without the need of electrophoretic display particles 32 of two colors. Hence, the requirements for kinds, dimensions, and so on can be reduced. Furthermore, the motion control of the electrophoretic display particles 32 become easier since the kinds of the electrophoretic display particles 32 is reduced, and thus it become easier to achieve bicolor or multicolor display of the electronic paper display device.

In addition, the slanted microbores 31 are oblique, and therefore the lower part of each of the slanted microbores 31 are covered by the adjacent slanted microbores 31; in this way, purity of the displayed colors can be higher, and white state reflectance can also be enhanced.

Figure 3:
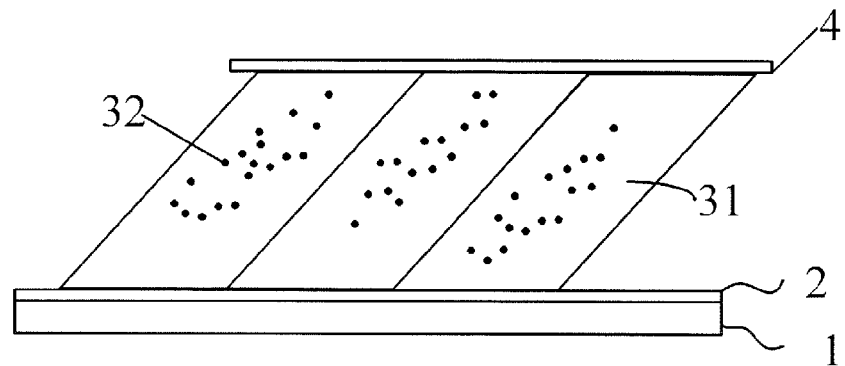
FIG. 3 is another structural schematic view of the electronic paper display device provided by the present invention.

Further, in the electronic paper display device of another embodiment of the present invention, as shown in FIG. 3, the slanted microbore layer 3 is further provided with drive electrodes 4. The voltage is applied via a first conducting layer 2 and the drive electrodes 4, causing the electrophoretic display particles 32 conduct electroporesis motion in the slanted microbores 31 so as to present different arrangement manners, hereby realizing the aim of displaying colors to exhibit different images.

Optionally, the substrate 1 can be a material such as glass, PET (polyethylene terephthalate), PEN (polyethylene naphthalate), PC (polycarbonate), PMMA (polymethacrylate), PMA (polyacrylate), PU (polyarethane), PTFE(polytetrafluorethylene), PE (polyvinylidene), PVC (chlorinated polyethylene), PBS (polybutadiene-styrene), PAN (polyacrylonitrile) or the like, and preferably may be glass, PET, PEN, PC, or PMMA.

Optionally, the first conducting layer 2 may be an inorganic transparent conductor material, such as Indium Tin Oxide (ITO), Indium Gallium Zinc Oxide (InGaZnO) and so on, and may also be an organic transparent conductor material such as poly-3,4-ethylene dioxy-thiophene (PEDOT), grapheme or the like, and preferably may be ITO material.

Preferably, the angle α between the slanted bore walls 312 and the substrate 1 is in a range from 30° to 80°.

For example, the slanted microbores 31 are formed of an insulating material. In order to not disturb the electroporesis motion of the electrophoretic display particles 32, it's preferred that the resistivity of the insulating material forming the slanted microbores 31 are greater than 107 Ohms·cm.

For example, the slanted microbores 31 may be formed of at least one of the methacrylic acid esters, ethoxyline resins, and urea-formaldehyde resins, and all the above substances are white-like or transparent curable gummy substance and can be subject to hardening through photocuring or thermocuring. If the slanted microbores 31 are white, they can be formed directly from at least one of the above substances, and in order to improve reflectance, the substance can be further added with white pigment or dye particles therein, such as magnesium oxide (MgO), titanium oxide (TiO) and the like. If the slanted microbores 31 are in a color other than while, they can be formed with at least one of the above substances in which pigment or dye particles of the color of the slanted microbores 31 are added. For example, when the slanted microbores 31 are black, they can be formed from at least one of the above substances added with a black pigment or dye. Naturally, the slanted microbores 31 can also be formed with other substances, such as a black insulating substance, and the present invention is not limited to these specific selections.

For example, the slanted microbores 31 are disposed in a regular array in the slanted microbore layer 3, but there's no limitation on the arrangement of the slanted microbores 31 in the embodiments of present invention. For example, the slanted microbores 31 can be arbitrarily arranged according to actual requirement for displaying.

As shown in FIG. 1, in this embodiment, the slanted microbores 31 have a same size and a same shape, and the orifices 311 are all in a rectangle shape, but this invention is not limited thereto. The size and shape of the slanted microbores 31 may or may not be the same, that is, the size and shape of the orifices 311 may or may not be the same. For example, the shape of the orifices 311 comprises at least one of the square, rectangle, triangle, hexagon, and circular shapes.

It should be noted, in the electronic paper display device provided by the embodiment of present invention, the colors of the slanted microbores 31 in the slanted microbore layer 3 may or may not be the same as one another, and there are provided electrophoretic display particles of at least one color in each of the slanted microbores 31. For example, the colors of the electrophoretic display particles provided in the respective slanted microbores 31 may or may not be the same as with the other slanted microbores. It's described specifically in the following. Also, it should be noted that the following specific description is provided given that human eyes are located below the substrate 1 when a consumer is in use, for example.

Embodiment 1

In this embodiment, the colors of the slanted microbores 31 are the same, and there are provided electrophonic display particles of one color within each of the slanted microbores 31, and the electrophonic display particles in each of the slanted microbores have the same color as that of the electrophonic display particles in rest of the slanted microbores so as to achieving double-color display.

For example, the slanted microbores 31 are white, and black electrophonic display particles 32 are enclosed in each of the slanted microbores 31, which make it possible for black and white display, that is, double-color display.

For example, the slanted microbores 31 are black, and white electrophonic display particles 32 are enclosed in each of the slanted microbores 31, which make it possible for black and white display, that is, double-color display.

For example, each of the slanted microbores 31 are of a monocolor such as black, white, blue, green, red, yellow, or the like, and the electrophonic display particles 32 in each of the slanted microbores 31 may also be of a monocolor such as black, white, blue, green, red, yellow, or the like; however, the color for the slanted microbores 31 are different from the color for the electrophonic display particles 32 so as to achieve double-color display.

Further, in the electronic paper display device for the implementation of double-color display in the present embodiment, a color filter can also be comprised in one example, and thus multicolor display can be achieved with the color filter.

For example, the color filter can be disposed under the substrate 1. Of course, it's possible to use the color filter directly for the substrate 1 and form the first conducting layer and the slanted microbore layer on the color filter.

Embodiment 2

In this embodiment, the colors of the slanted microbores 31 are the same, and the electrophonic display particles of one color are provided within each of the slanted microbores 31 so as to achieve multicolor display.

Display units are provided in the slanted microbore layer 3, and one display unit comprises at least two immediately adjacent slanted microbores 31, and the colors of the electrophonic display particles within the at least two immediately adjacent slanted microbore are different.

Figure 4:
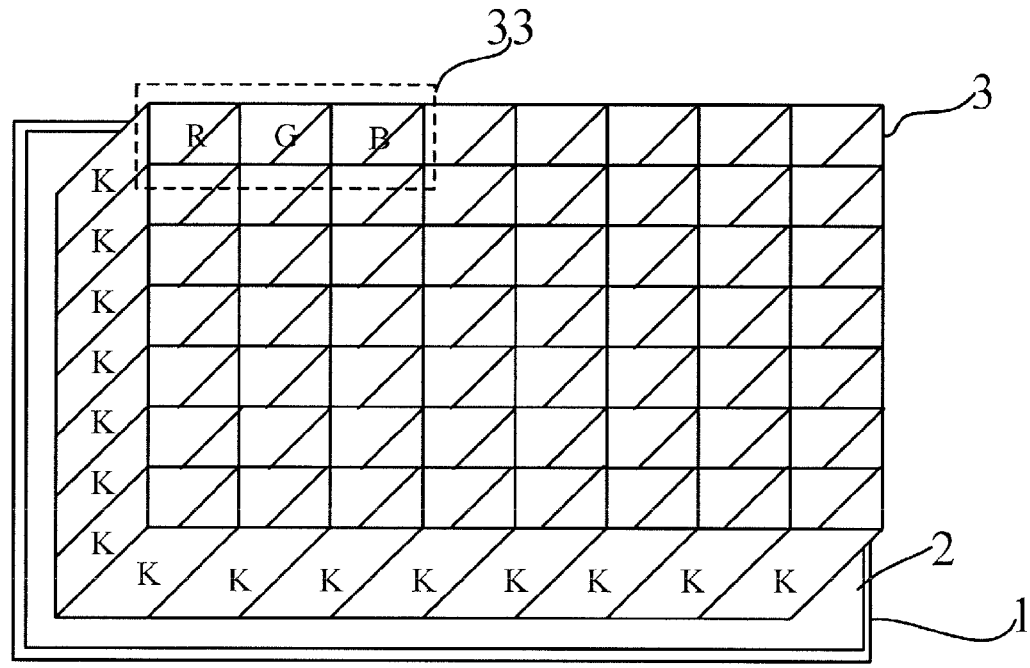
FIG. 4 is another structural schematic view of the electronic paper display device provided by the present invention.

For example, as shown in FIG. 4, the slanted microbores 31 are black (K), and there are provided display units 33 in the slanted microbore layer 3, one display unit 33 comprises three immediately adjacent slanted microbores 31, and the three immediately adjacent slanted microbores 31 have colors different from one another, that is, red (R), green (G), blue (B), respectively. Therefore, the three microbores can display red-black color, green-black color, and blue-black color, respectively, and colorization can be achieved with the combinations among them.

In another example, in order to improve reflectance of white level, the display unit 33 may comprise four immediately adjacent slanted microbores 31, and the electrophonic display particles 32 in the four immediately adjacent slanted microbores 31 have colors different from one another, that is, red (R), green (G), blue (B), white (W), respectively.

In the above examples, the slanted microbores 31 may be in white or another color. When the slanted microbores 31 are white, in order to improve the emissivity for black level, the display unit 33 may comprise four immediately adjacent slanted microbores 31, and the electrophonic display particles 32 within the four immediately adjacent slanted microbores 31 have colors different from one another, that is, red (R), green (G), blue (B), black (B), respectively.

Embodiment 3

Similar to the embodiment 2, the colors of the slanted microbores 31 are utilized for the colorization in this embodiment.

Display units are provided in the slanted microbore layer 31, and one display unit comprises at least two immediately adjacent slanted microbores, and the colors of the electrophonic display particles within the at least two immediately adjacent slanted microbore are different from each other.

Figure 5:
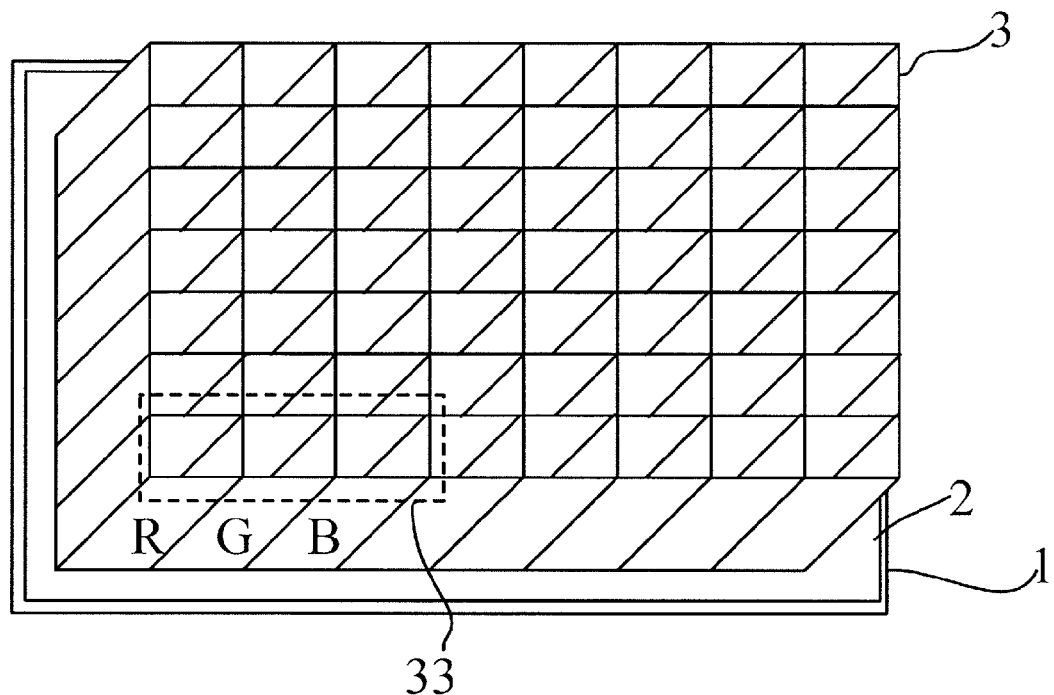
FIG. 5 is another structural schematic view of the electronic paper display device provided by the present invention.

For example, as shown in FIG. 5, there are provided display units 33 in the slanted microbore layer 3, one display unit 33 comprises three immediately adjacent slanted microbores 31, and the three immediately adjacent slanted microbores 31 have colors different from one another, that is, red (R), green (G), blue (B), respectively; however, the three slanted microbores 31 comprise electrophonic display particles 32 of the same color, for example, white, black or the like, or another possible color.

Of course, the electrophonic display particles within each of the slanted microbores and the rest of the slanted microbores may have different colors. For example, the electrophonic display particles 32 provided within the adjacent slanted microbores 31 have while color and black color, respectively.

In the above embodiment 2 and embodiment 3, the color of the slanted microbores 31 and the color of the electrophonic display particles 32 are combined in different ways so as to achieve multicolor display.

embodiment 4

In this embodiment, the electrophonic display particles provided within each of the slanted microbores 31 have at least two colors so as to achieve multicolor display.

For example, the slanted microbores 31 are red, and the electrophonic display particles provided within each of the slanted microbores 31 have two colors, that is, blue and green.

For example, the slanted microbores 31 are blue, and the electrophonic display particles provided within each of the slanted microbores 31 have two colors, that is, red and green.

Figure 6:
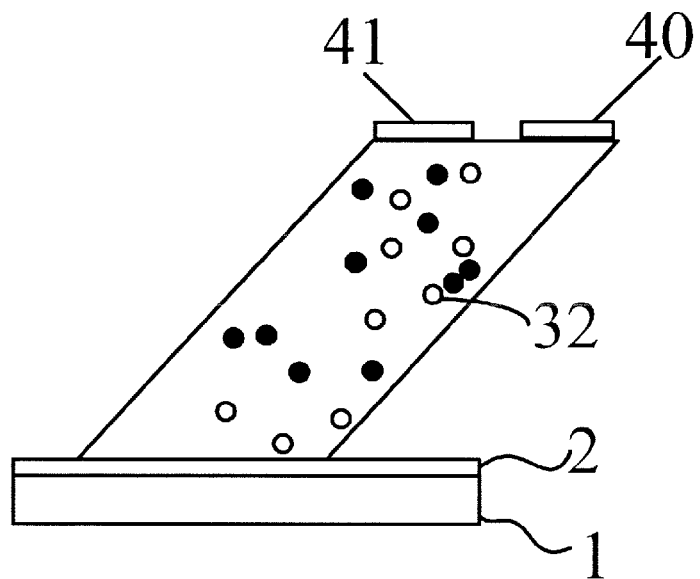
FIG. 6 is another structural schematic view of the electronic paper display device provided by the present invention.

When the electrophonic display particles having two colors are provided within each of the slanted microbores 31, in order to control the motion of the electrophonic display particles of each color, as shown in FIG. 6, it's necessary for a first electrode 40 and a second electrode 41 to be arranged on the slanted microbore layer 3 for driving the electrophonic display particles having the two colors.

Of course, the slanted microbores 31 may also have two or more colors, and for example, similar to the arrangement mode of the display unit in the above embodiments, at least two immediately adjacent slanted microbores 31 have different colors, respectively.

Correspondingly, the embodiments of the present invention provide further a method for making the foregoing electronic paper display device, comprising the steps of:

Step 101, providing a substrate forming with a first conducting layer;

Optionally, the substrate may be a material, such as glass, PET, PEN, PC, PMMA, PMA, PU, PTFE, PE, PVC, PBS, PVC, PAN and the like, and preferably glass, PET, PEN, PC, PMMA. For example, the first conducting layer may be an inorganic transparent conductor material, such as ITO, InGaZnO, or the like or an organic transparent conductor material such as PEDOT, graphene or the like, and preferably ITO.

Step 102, forming a slanted microbore layer with a plurality of slanted microbores having colors on the first conducting layer.

Each of the slanted microbores comprises an orifice, slanted bore walls and a bore bottom, the angle between the slanted bore walls and the substrate is less than 90°, and the vertical projection of the orifice onto the substrate is located within the vertical projection of the slanted bore walls onto the substrate or outside of the bore bottom of the slanted microbores.

Optionally, the slanted microbore layer having colors maybe formed on the first conducting layer by printing, angled photoetching or membrane adhering.

In one example, forming slanted microbore layer on the first conducting layer by printing comprises:

coating a curable glue film of a color onto the first conducting layer;

forming patterns for microbores on the curable glue film through cylinder printing; and curing the curable glue film which forms the patterns for the microbores.

Step 103, providing electrophoretic display particles in the slanted microbores, colors of the electrophoretic display particles being different from that of the slanted microbores; and Step 104, enclosing the orifices of the slanted microbores.

For example, the orifices of the slanted microbores maybe enclosed through a sealing-glue enclosing method or a membrane-adhering enclosing method.

All the above are just specific embodiments of the present invention, but the scope of the present invention is not limited thereto, and various changes and alternation can be easily obtained by the skilled in this art within the disclosed technical scope by this invention, all of which should be encompassed in the protection reach of the present invention. Hence, the protection scope of the present invention should be accord with the protection scope of the claims.

The invention claimed is:

1. An electronic paper display device comprising: a substrate, a first conducting layer on the substrate, and a slanted microbore layer provided on the first conducting layer, wherein the slanted microbore layer comprises display units and each display unit comprises four immediately adjacent slanted microbores of white, electrophoretic display particles are enclosed within the slanted microbores and have different colors from that of the slanted microbores;

each of the slanted microbores comprises an orifice, slanted bore walls and a bore bottom, the angle between the slanted bore walls and the substrate is less than 90°, and the vertical projection of the orifice onto the surface of the substrate is located outside of the bore bottom of the slanted microbore;

the electrophonic display particles within the four immediately adjacent slanted microbores of each display unit have colors different from one another of red, green, blue, and black, respectively.

2. The electronic paper display device according to claim 1, wherein the slanted microbores are composed of an insulating material having a resistivity greater than 107Ω.cm.

3. The electronic paper display device according to claim 1, wherein the shape of the orifice is at least one of square, rectangle, triangle, hexagon and circular.

4. The electronic paper display device according to claim 1, wherein the slanted microbores are composed of at least one of methacrylic acid esters, ethoxyline resins and urea-formaldehyde resins or is composed of the at least one added with a colorant or a dye.

5. The electronic paper display device according to claim 1, wherein colorless clear solution is also enclosed within the slanted microbores, and the electrophoretic display particle distributions are dispersed in the colorless clear solution.

6. The electronic paper display device according to claim 1, wherein each of the slanted microbores is provided with electrophoretic display particles of one color therein.

7. The electronic paper display device according to claim 1, wherein each of the slanted microbores is provided with electrophoretic display particles of two colors therein; and the slanted microbores each is provided thereon with a first electrode and a second electrode used for driving the electrophoretic display particles of two colors respectively.

8. A method for manufacturing an electronic paper display device, comprising:

providing a substrate formed with a first conducting layer;

forming a slanted microbore layer on the first conducting layer, wherein the slanted microbore layer comprises display units and each display unit comprises four immediately adjacent slanted microbores of white, and each of the slanted microbores comprises an orifice and slanted bore walls, the angle of the slanted bore walls to the substrate is less than 90°, and the vertical projection of the orifice onto the surface of the substrate is located outside of an bore bottom of the slanted microbore;

providing electrophoretic display particles within the slanted microbores, and the electrophoretic display particles having different color from that of the slanted microbores and;

enclosing the orifices of the slanted microbores;

wherein the electrophonic display particles within the four immediately adjacent slanted microbores of each display unit have colors different from one another of red, green, blue, and black, respectively.

9. The manufacturing method according to claim 8, wherein forming the slanted microbore layer on the first conducting layer comprises:

forming the slanted microbore layer on the first conducting layer by way of printing, angled photoetching or membrane adhering.

10. The manufacturing method according to claim 8, wherein forming the slanted microbore layer on the first conducting layer by way of printing comprises:

coating a curable glue film of a color onto the first conducting layer;

forming patterns for the microbores on the curable glue film through cylinder printing; and curing the curable glue film which forms the patterns for the microbores.

11. The manufacturing method according to claim 8, wherein enclosing the orifices of the slanted microbores comprises:

enclosing the orifices of the slanted microbores by an sealing compound enclosing method or a membrane adhering enclosing method.

12. The manufacturing method according to claim 8, wherein each of the slanted microbores is provided with electrophoretic display particles of two colors therein; and the method also comprises providing a first electrode and a second electrode used for driving the electrophoretic display particles of two colors respectively on the slanted microbore layer.

13. The manufacturing method according to claim 8, wherein each of the slanted microbores is provided with electrophoretic display particles of one color therein.

* * * * *